(12) United States Patent
Morita

(10) Patent No.: US 7,538,420 B2
(45) Date of Patent: May 26, 2009

(54) PACKAGE MOUNTED MODULE

(75) Inventor: Yoshihiro Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 146 days.

(21) Appl. No.: 11/832,978

(22) Filed: Aug. 2, 2007

(65) Prior Publication Data

US 2008/0006924 A1    Jan. 10, 2008

Related U.S. Application Data

(63) Continuation of application No. PCT/JP2005/001474, filed on Feb. 2, 2005.

(51) Int. Cl.
*H01L 23/02* (2006.01)
(52) U.S. Cl. ........................ 257/686; 361/687
(58) Field of Classification Search .................. 257/706, 257/712, 686, 777, 727, E23.499; 361/687
See application file for complete search history.

(56) References Cited

U.S. PATENT DOCUMENTS

| 7,349,223 | B2 * | 3/2008 | Haemer et al. ............... 361/767 |
| 2004/0084764 | A1 | 5/2004 | Ishimine et al. | |
| 2008/0089024 | A1 * | 4/2008 | McAllister et al. .......... 361/687 |

FOREIGN PATENT DOCUMENTS

| JP | 5-304227 A | 11/1993 |
| JP | 11-220055 A | 8/1999 |
| JP | 2000-315054 A | 11/2000 |
| JP | 2003-008186 A | 1/2003 |
| JP | 2004-165586 A | 6/2004 |
| JP | 2004-288834 A | 10/2004 |

OTHER PUBLICATIONS

International Search Report of PCT/JP2005/001474, date of mailing Mar. 8, 2005.
Translation of the International Preliminary Report on Patentability of International Application No. PCT/JP 2005/001474, with Form PCT/IB/373 and Form PCT/ISA/237.

\* cited by examiner

*Primary Examiner*—Nathan W Ha
(74) *Attorney, Agent, or Firm*—Westerman, Hattori, Daniels & Adrian, LLP.

(57) ABSTRACT

A package mounted module wherein a package board on the topside surface of which a semiconductor chip such as an LSI is mounted is further mounted on the topside surface of the motherboard of a large-scale computing machine such as a large-sized computer, and a stiffener is provided on the underside surface of the motherboard. In order to improve the reliability of solder bonding, a stiffener is fixed to the motherboard with screws at plural locations on the periphery of the stiffener and is also fixed to the motherboard with a screw in the central part of the stiffener.

4 Claims, 4 Drawing Sheets

PACKAGE MOUNTED MODULE

This application is a continuation of international application PCT/JP2005/001474, filed on Feb. 2, 2005.

TECHNICAL FIELD

The present invention relates to a package mounted module having a semiconductor chip such as an LSI, a package board on which the semiconductor chip is disposed, and a motherboard of a large-scale computing machine such as a large-sized computer on which the package board is mounted.

BACKGROUND ART

In recent years, it has become common to mount a large package having more than 2000 terminal pins on a board (mainly motherboard) of a large-scale computing machine, such as a large-sized computer, because of an increase in the number of signals, and the size of such a large package has also increased to the extent of exceeding 40 mm×40 mm. Since the package is so large in size that it is equipped with a stiffener intended to prevent the warpage of the package as a whole.

The stiffener, after being solder-bonded to the motherboard, is attached to the motherboard with mechanical components for fastening purposes (mainly screws).

FIG. 3 is a schematic cross-sectional view illustrating a conventional package mounted module.

A package mounted module 20 illustrated in FIG. 3 has a structure wherein a package board 11 is solder-bonded to a motherboard 21 by the fusion and fixation of solder balls 15 on the underside surface of the package board 11, so that the entirety of a package board module 10 is mounted on the topside surface of the motherboard 21.

Note here that the package board module 10 has a structure wherein an LSI chip 12 is mounted on the topside surface of the package board 11 by the fusion and fixation of solder balls 13. In addition, the package board module 10 is provided with a stiffener 14 fixed in contact with the topside surface of the package board 11 so as to surround the LSI chip 12. The stiffener 14 is intended to support the package board 11 and prevent the warpage of the package board 11.

Furthermore, in the package mounted module 20 illustrated in FIG. 3, a stiffener 22 is disposed on the underside surface of the motherboard 21 in a position to interpose the motherboard 21 between the stiffer 22 and the package board 11.

The stiffener 22 is fixed to the motherboard 21 with fastening components (screws 23 here) to support the motherboard 21, thereby preventing the warpage of the motherboard 21.

FIG. 4 is a schematic view illustrating a positional relationship among respective members when the package mounted module 20 is viewed from above.

The stiffener 22 has an area wider than that of the package board 11, and the motherboard 21 and the stiffener 22 are fixed to each other with fastening components (screws 23 here) at multiple locations on the periphery of the stiffener 22 falling outside the package board 11 when a stack of the package board 11, motherboard 21 and stiffener 22 is viewed from above.

As described above, the stiffener 22 is fixed such that the periphery thereof falling outside the package board 11 is fastened with fastening components (mainly screws). Accordingly, stress arises in solder-bonded portions between the package board 11 and the motherboard 21 due to a temperature difference between a solder melting point and a normal temperature or a temperature difference between the points in time of apparatus operation and apparatus shutdown and due to external mechanical stress (connector plugging/unplugging, vibration, drop, or the like), thus significantly affecting the reliability of solder bonding.

This is especially true in recent years, as the use of lead has been prohibited by regulations on hazardous substances and high melting point solder such as tin-silver-copper solder (melting point: 218° C.) has come into use in place of conventionally used eutectic tin-lead solder (melting point: 183° C.). As a result, the range of temperatures from a solder melting point to a normal temperature has widened, thereby causing more intense stress to occur.

Note here that Patent Document 1 discloses a package structure wherein a first pressurizing force for joining a heat sink and a package board is separated from a second pressurizing force for pressurizing the package board to a printed board. In addition, Patent Document 2 discloses that, for the TAB tape side face of a stiffener, at least portions of the stiffener positioned immediately above solder balls are removed and dimples or through-holes are formed, thereby providing elasticity between the solder balls and the stiffener.

The technique disclosed in Patent Document 1 is intended to prevent the degradation of reliability due to pressurizing forces during bonding and is not intended to prevent the occurrence of stress after solder bonding.

The technique disclosed in Patent Document 2 is useful in preventing the occurrence of stress during bonding, but the structure disclosed therein is vulnerable to vibration since elasticity is provided between the solder balls and the stiffener.

Patent Document 1: Japanese Patent Laid-Open No. 2004-165586

Patent Document 2: Japanese Patent Laid-Open No. 11-220055

DISCLOSURE OF THE INVENTION

In view of the circumstances described above, it is an object of the present invention to provide a package mounted module wherein the reliability of solder bonding is improved.

A package mounted module of the present invention for achieving the object includes:

a package board on the topside surface of which a semiconductor chip is mounted;

a motherboard onto the topside surface of which the underside surface of the package board is solder-bonded; and a stiffener disposed on the underside surface of the motherboard in a position to interpose the motherboard between the stiffener and the package board and fixed to the motherboard with fastening components, wherein the stiffener is fixed to the motherboard with fastening components at plural locations on the periphery of the stiffer and is also fixed to the motherboard in the central part of the stiffer with a fastening component.

According to the package mounted module of the present invention, the fastening interval of the stiffener is short since the stiffener is fixed to the motherboard with fastening components at plural locations on the periphery of the stiffener and is also fixed to the motherboard in the central part of the stiffener. Consequently, the warpage, stress and the like of the motherboard are reduced and the reliability of solder bonding is improved.

Note here that it is preferable that the stiffener has an area wider than that of the package board and the peripheral part and central part of the stiffer are regions respectively falling outside and falling within the package board in a perspective view of a stack of the package board, the motherboard and the stiffener.

By defining the peripheral part as a region external to the package board, it is possible to secure an area for solder bonding between the underside surface of the package board and the motherboard.

In addition, in the package mounted module of the present invention, screws are typically used as the fastening components and the package board is typically solder-bonded to the topside surface of the motherboard by the fusion and fixation of solder balls arranged on the underside surface of the package board.

As described above, according to the present invention, the warpage, stress and the like of the motherboard are reduced and the reliability of solder bonding is significantly improved.

BEST MODE FOR CARRYING OUT THE INVENTION

An embodiment of the present invention will hereinafter be described.

Figure 1:
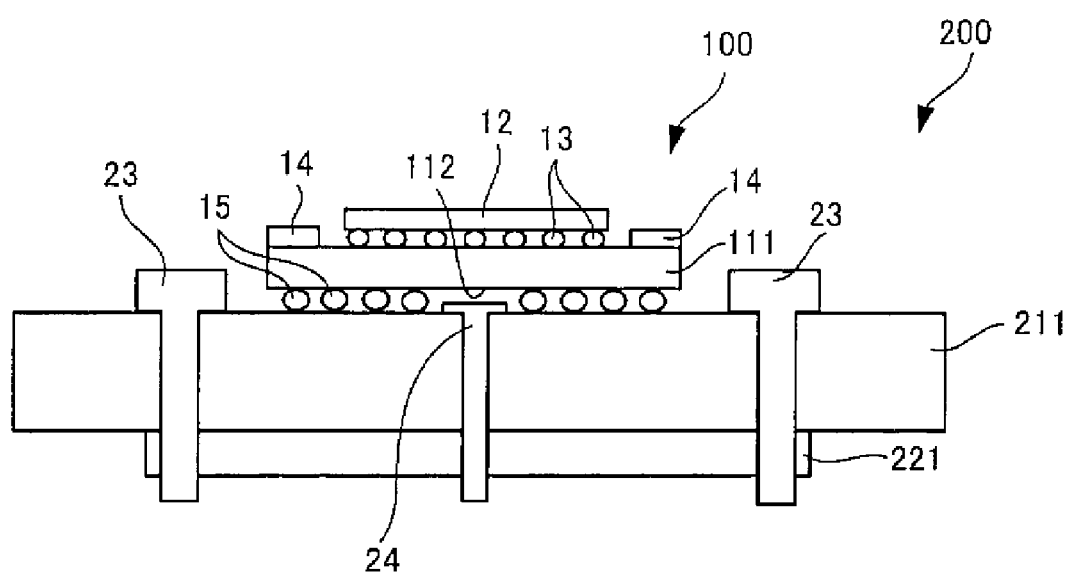
FIG. 1 is a schematic cross-sectional view illustrating a package mounted module according to an embodiment of the present invention.

FIG. 1 is a schematic cross-sectional view illustrating a package mounted module according to an embodiment of the present invention.

Figure 3:
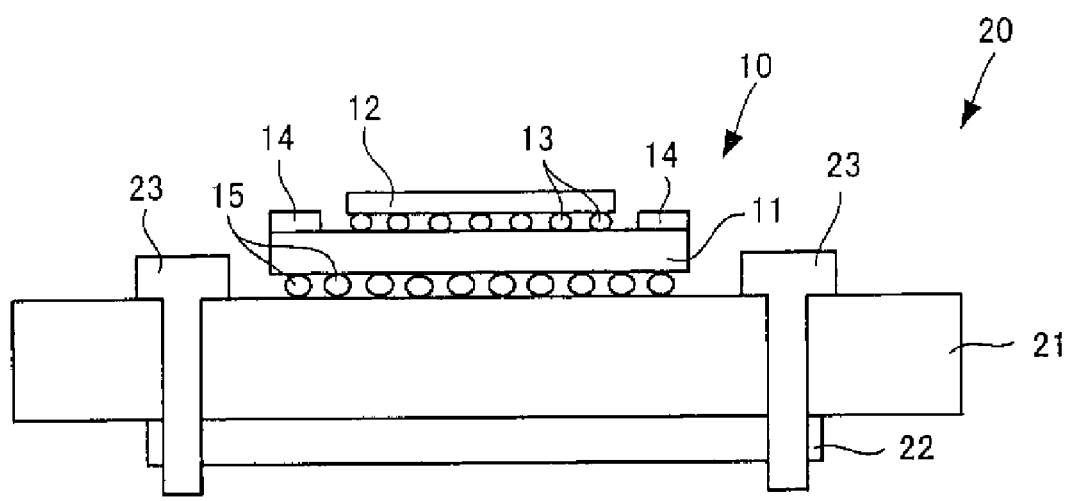
FIG. 3 is a schematic cross-sectional view illustrating a conventional package mounted module.

In FIG. 1, elements same as those shown in FIG. 3 that is a drawing of a conventional package board module are assigned with the same reference numerals as those assigned to FIG. 3.

A package mounted module 200 illustrated in FIG. 1 has a structure wherein a package board module 100 is mounted on a motherboard 211.

The package board module 100 is structured so that an LSI chip 12 is mounted on the topside surface of a package board 111 by the fusion and fixation of solder balls 13 and the package board module 100 is provided with a stiffener 14 fixed in contact with the topside surface of the package board 111 so as to surround the LSI chip 12. Note here that the package board 111 slightly differs from the package board 11 shown in FIG. 3 in that a space area 112 having no solder balls 15 is formed in the central part of the underside surface of the package board 111. This space area is intended to secure a space for a screw 24, as will be explained later.

In addition, in the motherboard 211 constituting the package mounted module 200 illustrated in FIG. 1, there are formed mounting holes for the screws 23 to penetrate through as in the motherboard 21 shown in FIG. 3 and, unlike the motherboard 21 shown in FIG. 3, there is further formed a mounting hole for the screw 24 to penetrate through.

Furthermore, in the package mounted module 200 illustrated in FIG. 1, a stiffener 221 is disposed on the underside surface of the motherboard 211 in a position to interpose the motherboard 211 between the stiffener 221 and the package board 111.

In contrast to the stiffener 22 shown in FIG. 3, there is formed in the stiffener 221 a screw hole for fixing with the screw 24 not found in the stiffener 22 shown in FIG. 3, in addition to the screw holes for fixing with the screws 23 also formed in the stiffener 22 shown in FIG. 3.

Figure 2:
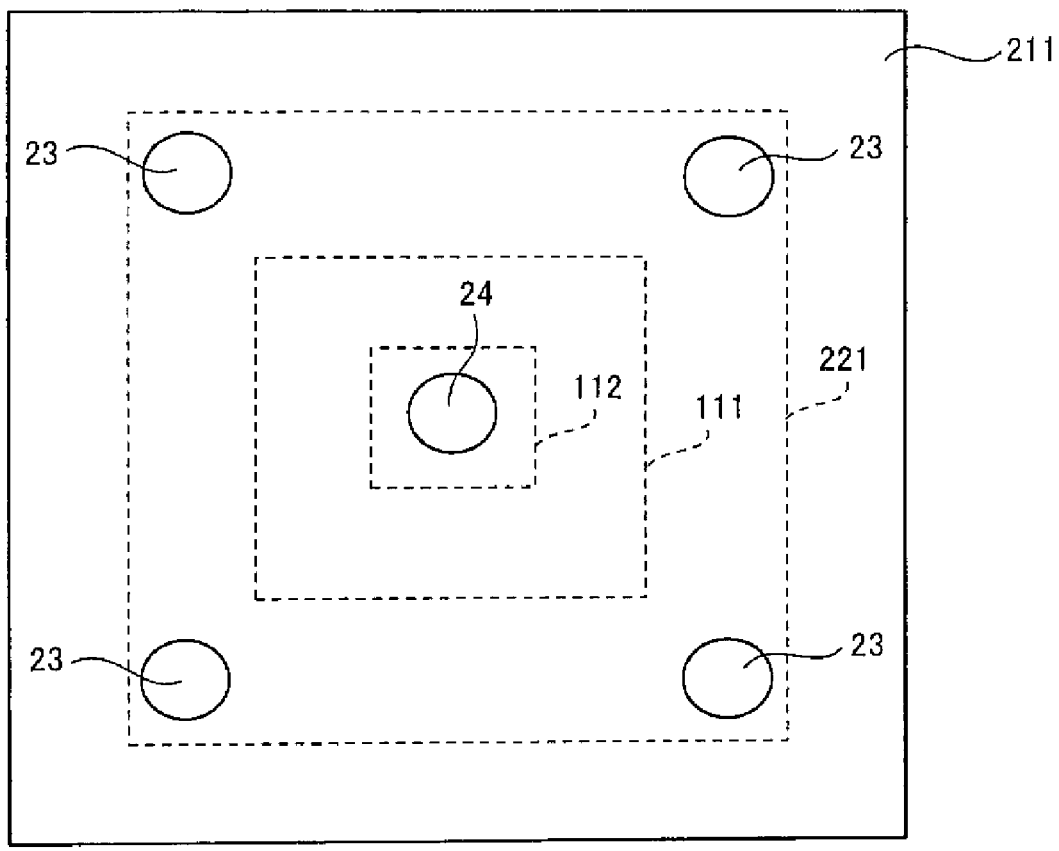
FIG. 2 is a schematic view illustrating a positional relationship among respective members when the package mounted module shown in FIG. 1 is viewed from above.

FIG. 2 is a schematic view illustrating a positional relationship among respective members when the package mounted module 200 shown in FIG. 1 is viewed from above.

The stiffener 221 has an area wider than that of the package board 111. In addition, the motherboard 211 and the stiffener 221 are fixed to each other with the screws 23 at four locations on the periphery of the stiffener 221 falling outside the package board 111 when a stack of the package board 111, motherboard 211 and stiffener 221 is viewed from above. The motherboard 211 and the stiffener 221 are also fixed to each other with the screw 24 within a space area 112 in the central part of the package board 111 overlapping therewith and having no solder balls.

The stiffener 221 is fixed to the motherboard 211 with the screws 23 and 24 before the package board module 100 is mounted on the motherboard 211. Then, the package board module 100 is solder-bonded to the motherboard 211 by the fusion and fixation of solder balls 15 so that the entirety of the package board module 100 is mounted on the topside surface of the motherboard 211.

Figure 4:
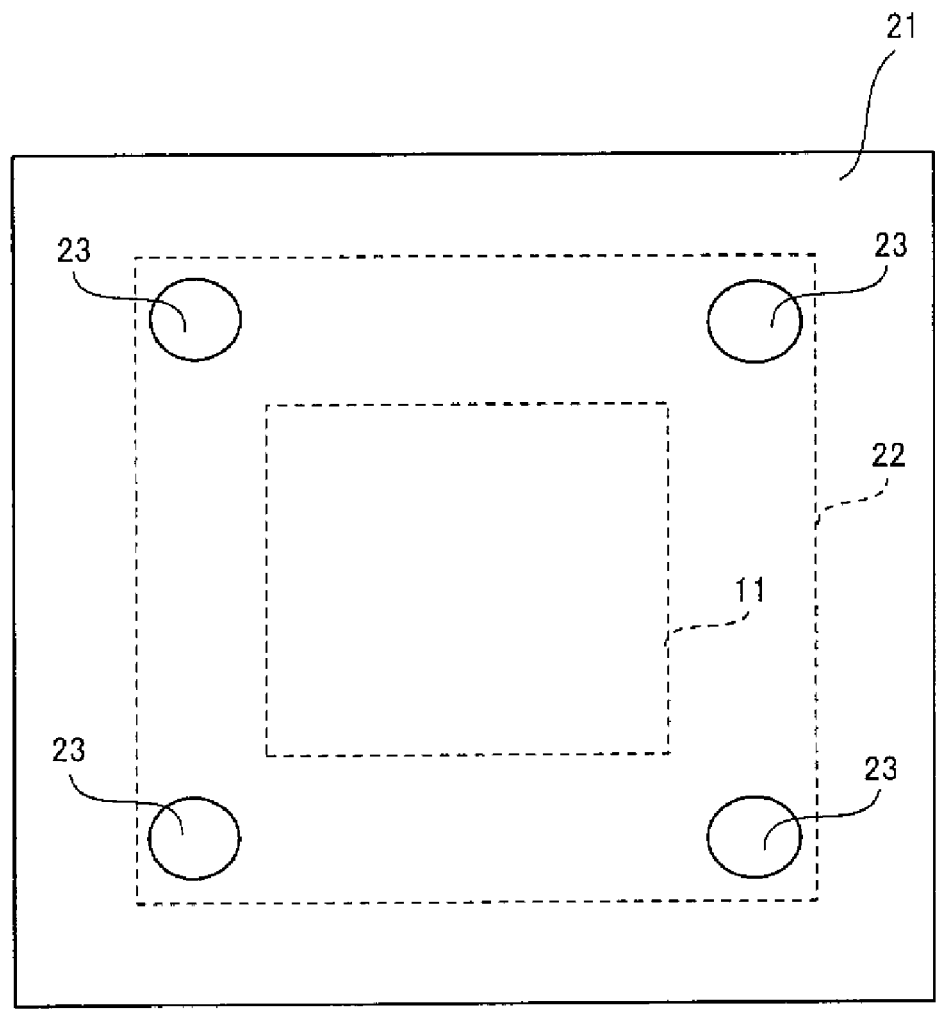
FIG. 4 is a schematic view illustrating a positional relationship among respective members when the package mounted module shown in FIG. 3 is viewed from above.

As heretofore described, according to the embodiment, the stiffener 221 is also fixed to the motherboard 211 in the central part of the stiffener 221 overlapping with the package board 111 with the screw 24, in addition to the screws 23. Accordingly, the distance between the fixing points of the stiffener and the motherboard (distance between screws) is short, as compared with the conventional examples (FIGS. 3 and 4) and, therefore, the warpage, stress and the like of the motherboard 211 are reduced and the reliability of solder bonding is improved.

What is claimed is:

1. A package mounted module comprising:
    a package board on a topside surface of which a semiconductor chip is mounted;
    a motherboard onto a topside surface of which an underside surface of the package board is solder-bonded; and
    a stiffener disposed on an underside surface of the motherboard in a position to interpose the motherboard between the stiffener and the package board and fixed to the motherboard with fastening components,
    wherein the stiffener is fixed to the motherboard with fastening components at a plurality of locations on a periphery of the stiffer and is also fixed to the motherboard in a central part of the stiffer with a fastening component.

2. The package mounted module according to claim 1, wherein the stiffener has an area wider than that of the package board, and the peripheral part and the central part of the stiffer are regions respectively falling outside and falling within the package board in a perspective view of a stack of the package board, the motherboard and the stiffener.

3. The package mounted module according to claim 1, characterized in that the fastening components are screws.

4. The package mounted module according to claim 1, wherein the package board is solder-bonded to the topside surface of the motherboard by fusion and fixation of solder balls arranged on the underside surface of the package board.

* * * * *